United States Patent
Huang et al.

(10) Patent No.: US 9,368,342 B2
(45) Date of Patent: Jun. 14, 2016

(54) DEFECT-FREE RELAXED COVERING LAYER ON SEMICONDUCTOR SUBSTRATE WITH LATTICE MISMATCH

(71) Applicant: GLOBALFOUNDRIES Inc., Grand Cayman, KY (US)

(72) Inventors: Haigou Huang, Rexford, NY (US); Huang Liu, Mechanicville, NY (US); Jin Ping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 57 days.

(21) Appl. No.: 14/252,447

(22) Filed: Apr. 14, 2014

(65) Prior Publication Data
US 2015/0295047 A1 Oct. 15, 2015

(51) Int. Cl.
  *H01L 21/02* (2006.01)
  *H01L 21/311* (2006.01)
  *H01L 21/306* (2006.01)

(52) U.S. Cl.
  CPC ...... *H01L 21/02381* (2013.01); *H01L 21/0245* (2013.01); *H01L 21/0262* (2013.01); *H01L 21/02439* (2013.01); *H01L 21/02521* (2013.01); *H01L 21/02532* (2013.01); *H01L 21/30604* (2013.01); *H01L 21/31111* (2013.01); *H01L 21/02639* (2013.01)

(58) Field of Classification Search
  CPC .................. H01L 21/02381; H01L 21/02439; H01L 21/0262; H01L 21/02521; H01L 21/0245; H01L 21/02532; H01L 21/31111; H01L 21/30604; H01L 21/02639
  See application file for complete search history.

(56) References Cited

U.S. PATENT DOCUMENTS

| | | | |
|---|---|---|---|
| 6,995,078 B2 | 2/2006 | Liu et al. | |
| 7,064,037 B2 | 6/2006 | Liu | |
| 2003/0107032 A1* | 6/2003 | Yoshida | H01L 21/02381 257/19 |
| 2003/0127646 A1* | 7/2003 | Christiansen | H01L 21/02381 257/55 |
| 2004/0075105 A1* | 4/2004 | Leitz | C30B 25/02 257/190 |
| 2004/0242006 A1* | 12/2004 | Bedell | H01L 21/02381 438/692 |
| 2012/0299155 A1* | 11/2012 | Liu | H01L 29/1054 257/609 |
| 2015/0295047 A1* | 10/2015 | Huang | H01L 29/165 257/190 |

OTHER PUBLICATIONS

Liu et al., "A Novel Thin Buffer Concept for Epitaxial Growth of Relaxed SiGe Layers with Low Threading Dislocation Density," Electrochemical and Solid-State Letters, 8, 2005, pp. G60-G62.

(Continued)

*Primary Examiner* — Jarrett Stark
(74) *Attorney, Agent, or Firm* — Wayne F. Reinke, Esq.; Heslin Rothenberg Farley & Mesiti P.C.

(57) ABSTRACT

A defect-free, relaxed semiconductor covering layer (e.g., epitaxial SiGe) over a semiconductor substrate (e.g., Si) is provided having a strain relaxation degree above about 80% and a non-zero threading dislocation density of less than about 100/cm$^2$. A lattice mismatch exists between the substrate and the covering layer. The covering layer also has a non-zero thickness that may be less than about 0.5 microns. The strain relaxation degree and threading dislocation are achieved by exposing defects at or near a surface of an initial semiconductor layer on the substrate (i.e., exposing defects via selective etch and filling-in any voids created), planarizing the filled-in surface, and creating the covering layer (e.g., growing epitaxy) on the planarized, filled-in surface, which is also planarized.

10 Claims, 3 Drawing Sheets

(56) References Cited

OTHER PUBLICATIONS

Wong et al., "Strain relaxation mechanism in a reverse compositionally graded SiGe heterostructure," Applied Physics Letters 90, 2007, pp. 061913-1-061913-3.

Wong et al., "Threading dislocation reduction by SiGeC domains in SiGe/SiGeC heterostructure: Role of pure edge dislocations," Applied Physics Letters 89, 2006, pp. 231906-1-231906-3.

Wong et al., Low-dislocation-density strain relaxation of SiGe on a SiGe/SiGeC buffer layer, Applied Physics Letters 88, 2006, pp. 041915-1-041915-3.

* cited by examiner

DEFECT-FREE RELAXED COVERING LAYER ON SEMICONDUCTOR SUBSTRATE WITH LATTICE MISMATCH

BACKGROUND OF THE INVENTION

1. Technical Field

The present invention generally relates to semiconductor structures and the fabrication thereof. More particularly, the present invention relates to a semiconductor structure and method of making same having a semiconductor layer on a substrate, the layer having a strain relaxation degree above about 80% and a threading dislocation density of less than about $100/cm^2$.

2. Background Information

Strain-relaxed semiconductor material on a semiconductor substrate, such as silicon germanium on a silicon substrate, has numerous potential applications for electrical and optoelectrical devices. For practical applications, it is desirable that the layer have a high degree of strain relaxation, a low threading dislocation density, and a smooth surface. In addition, minimizing the layer thickness is also desirable, because as the layer thickness increases, production costs rise and significant technological issues occur, such as poor thermal conductivity associated with the material. These desired characteristics are often self-contradictory according to experimental results and theoretical modeling. For example, both experimental results and theoretical models indicate that the strain relaxation degree for SiGe on Si substrate depends on the SiGe layer thickness—the thicker the layer, the higher the strain relaxation degree. A high degree of strain relaxation (on the order of 90%) is expected only for very thick films, but is not practical in terms of cost. Similarly, the threading dislocation density (TDD) is shown as a function of the SiGe layer thickness, whereby TDD decreases with increasing SiGe layer thickness. As a result, it is a challenge to manufacture thin SiGe on Si substrate with a high degree of strain relaxation and low TDD for device applications.

A need therefore exists for the cost-effective manufacture of a strain-relaxed semiconductor layer with a high strain relaxation degree, a low TDD, and a reduced layer thickness that is viable for volume production.

SUMMARY OF THE INVENTION

The shortcomings of the prior art are overcome and additional advantages are provided through the provision, in one aspect, of a method of fabricating a semiconductor structure. The method includes providing a starting semiconductor structure, the structure including a semiconductor substrate including at least one first semiconductor material, and a second layer of at least one second semiconductor material on the substrate. A lattice mismatch exists existing between the substrate and the second layer, and at least one defect is present and exposable in the second layer. The method further includes exposing the at least one defect, filling-in any voids in the second layer created by the exposing, and covering the second layer after the filling-in with a semiconductor covering layer. The covering layer has a strain relaxation degree above about 80% and a non-zero threading dislocation density of less than about $100/cm^2$.

In accordance with another aspect, a semiconductor structure is provided. The structure includes a semiconductor substrate, including at least one first semiconductor material, a second layer of at least one second semiconductor material on the substrate, and a semiconductor covering layer on the second layer. A lattice mismatch exists between the substrate and the covering layer, at a boundary between the second layer and the semiconductor covering layer is at least one filled indent, the at least one filled indent being filled with filler material, and the covering layer has a strain relaxation degree above about 80% and a non-zero threading dislocation density of less than about $100/cm^2$.

These, and other objects, features and advantages of this invention will become apparent from the following detailed description of the various aspects of the invention taken in conjunction with the accompanying drawings.

DETAILED DESCRIPTION OF THE INVENTION

Figure 1:
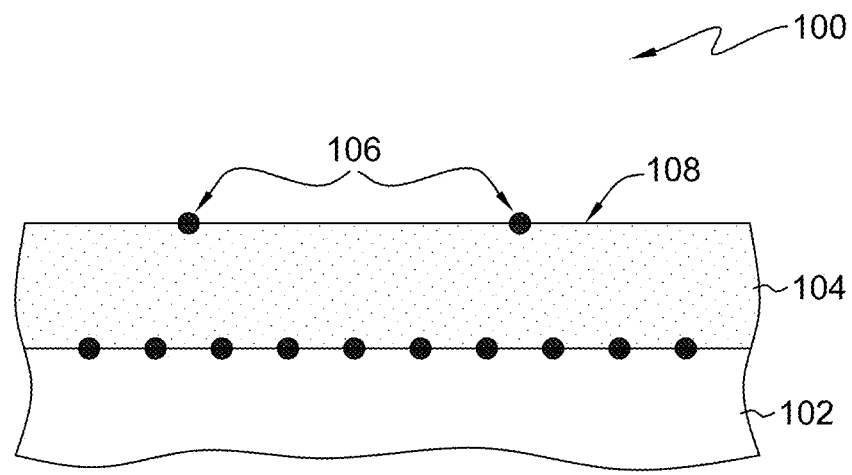
FIG. 1 is a cross-sectional view of one example of a starting semiconductor structure with one or more exposable defects in a semiconductor layer above the substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"

(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting semiconductor structure with one or more defects in a semiconductor layer above the substrate at or near the surface thereof. The starting structure includes a substrate 102 of a first semiconductor material and a layer 104 of a second semiconductor material. The semiconductor material for the substrate may include any suitable semiconductor material, for example, silicon (Si), gallium arsenide (GaAs) or indium phosphide (InP). In addition, the substrate may be a bulk substrate (e.g., wafer). The layer of second semiconductor material includes one or more semiconductor materials and exhibits a lattice mismatch with the substrate. Examples of possible second semiconductor materials generally include one or more semiconductor materials from Groups III-V of the Periodic Table of Elements, for example, silicon germanium (SiGe), germanium (Ge), indium gallium arsenide (InGaAs), cadmium telluride (CdTe), or mercury cadmium telluride (CdHgTe). As shown in FIG. 1, one or more defect(s) are present in layer 104, including defects 106 at a top surface 108 of the layer of second semiconductor material. Typically, the defects are distributed along the depth of the layer or film, usually with the density decreasing from the base (i.e., the interface with substrate 102) to surface. However, for purposes of the present invention, only defects at or near the surface are of interest and are referred to herein as "exposable." As used herein, the term "defect" or "defects" refers to one or more dislocations (e.g., threading dislocations) or irregularities in the lattice structure.

Figure 2:
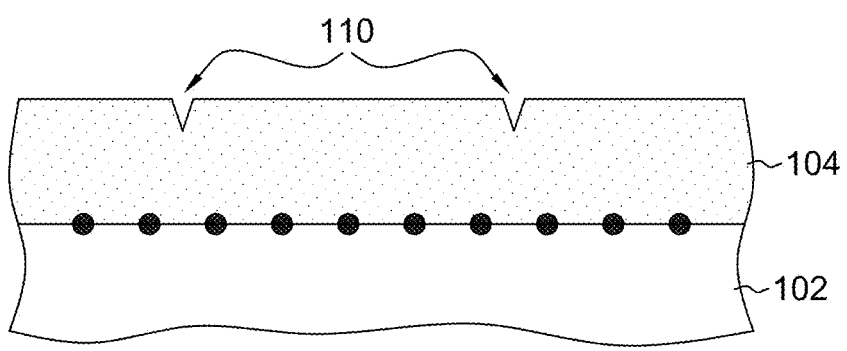
FIG. 2 depicts one example of the structure of FIG. 1 after exposing the defect(s), in accordance with one or more aspects of the present invention.

FIG. 2 depicts one example of the structure of FIG. 1 after exposing the defect(s) 106. Exposing the defect(s) refers to actual removal of material from the surface 108 of layer 104 in an area covering the defect, leaving voids 110 and exposing the defects. Preferably, removal of the material is minimized, while still exposing the defect. For example, defect exposure (i.e., removal of the material in layer 104 covering a given defect) may be accomplished using a dry etch or wet etch selective to the defect. As one skilled in the art will know, areas with defects etch significantly faster than areas without defects; hence, the etch is considered to be selective to the defects. In one example, the second semiconductor material includes silicon germanium and the selective etch for that is preferably dry, and may include, for example, using hydrochloric acid in an atmosphere of hydrogen gas at a temperature above about 600 degrees Celsius.

Figure 3:
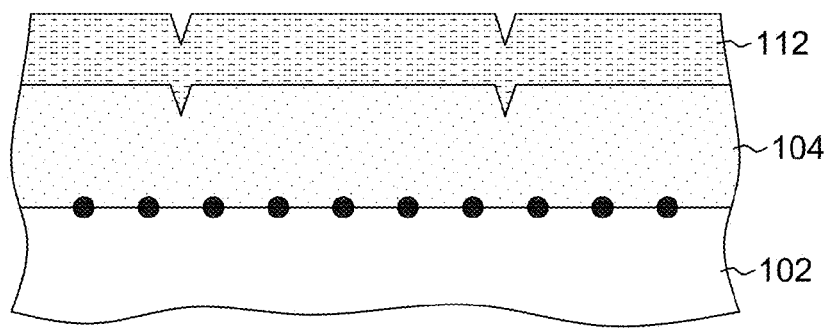
FIG. 3 depicts one example of the structure of FIG. 2 after deposition of a layer of filler material over the exposed defect(s), in accordance with one or more aspects of the present invention.

FIG. 3 depicts one example of the structure of FIG. 2 after deposition of a layer of filler material over the layer with exposed defect(s). The layer 112 of filler material may include, for example, an oxide or a nitride. In one example, where the substrate 102 includes silicon and the material of layer 104 includes silicon germanium, the filler material may include, for example, an oxide. Deposition of the oxide may be accomplished using, for example, a form of chemical vapor deposition (CVD), including, e.g., conventional CVD and low-pressure CVD (LPCVD). In either case, as one skilled in the art will know, a silicon source and an oxygen source are needed. The silicon source may be, for example, tetraethyl orthosilicate (TEOS) or silane ($SiH_4$). The oxygen source may be, for example, oxygen ($O_2$) or nitrous oxide ($N_2O$). Further, as one skilled in the art will know, LPCVD uses sub-atmospheric pressures. In a variant of the present example, a nitride is used as the filler material. A silicon-containing source and a nitrogen-containing source are needed. For example, the silicon source may be silicon dioxide ($SiO_2$), dichlorosilane ($H_2SiCl_2$), also known as "DCS," while the nitrogen source may be, e.g., ammonia ($NH_3$), yielding silicon nitride ($Si_3N_4$).

Figure 4:
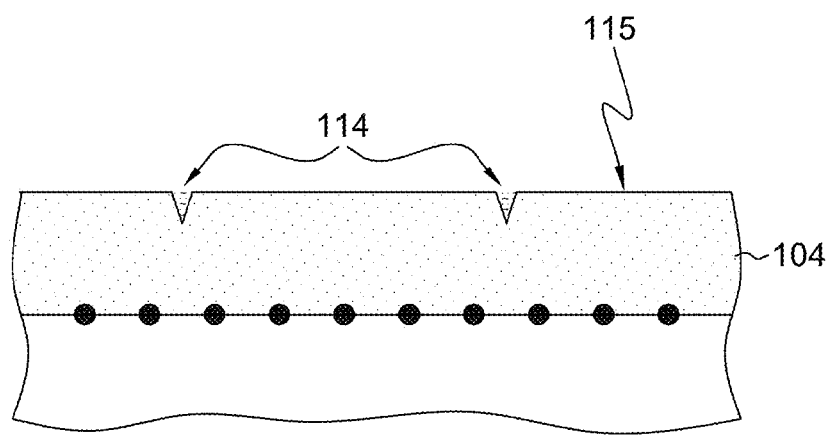
FIG. 4 depicts one example of the structure of FIG. 3 after removal of the filler layer above the filled-in exposed defect(s) and planarizing, in accordance with one or more aspects of the present invention.

FIG. 4 depicts one example of the structure of FIG. 3 after removal of the filler layer above the filled-in defect(s) and then planarizing, resulting in planarized surface 115. Preferably, removal of the unwanted filler material above the filled voids 114, and planarizing are both accomplished in a same process, but they need not be. In one example, where the substrate includes silicon, the material of layer 104 includes silicon germanium, and the filler material includes an oxide, oxide removal and planarizing of the surface of the silicon germanium and filled voids may be accomplished using a chemical-mechanical polishing (CMP) technique, for example, using a Ceria-based (i.e., Cerium (IV) oxide ($CeO_2$)) slurry and stopping on layer 104. In a preferred variant, Cerium (III) oxide is used, which is more stable at standard conditions for temperature and pressure.

Figure 5:
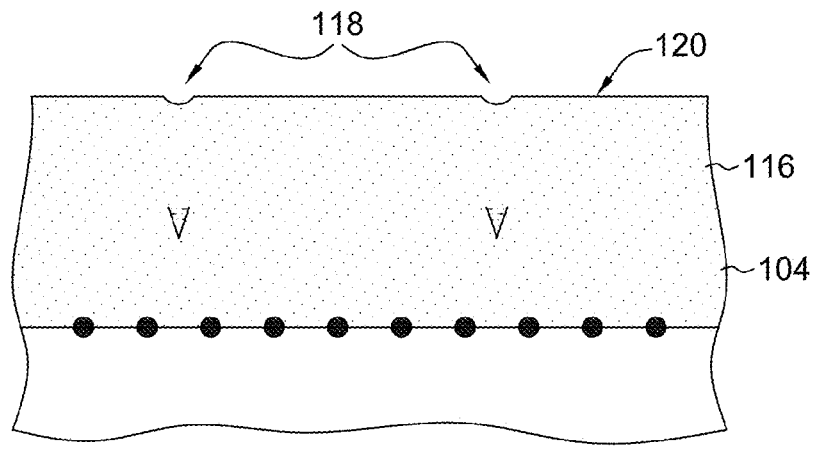
FIG. 5 depicts one example of the structure of FIG. 4 after creating a covering layer of semiconductor material, in accordance with one or more aspects of the present invention.

FIG. 5 depicts one example of the structure of FIG. 4 after creating additional semiconductor material 116 on layer 104, covering the planarized surface (115, FIG. 5). In one example, the additional material may be created by growing epitaxial semiconductor material on the surface. For example, where the epitaxial material includes silicon germanium, epitaxial silicon germanium may be grown by, for example, using a CVD process, such as, for example, LPCVD. The silicon source may be, for example, silane ($SiH_4$) or DCS, and the germanium source may be, for example, germane ($GeH_4$) or digermane ($Ge_2H_6$). For epitaxial materials other than SiGe, molecular beam epitaxial growth (MBE) or metal organic CVD (MOCVD) are preferred processes. As one skilled in the art will know, MBE uses a high vacuum with slow deposition rate and no carrier gases to deposit single crystals, and MOCVD uses metal organic precursors. Note, there may be small indentations 118 above the filled voids if any filler material was lost during removal and planarization.

The thickness of the additional material 116 will depend on a number of factors, including the type of additional material used, the application, the desired defect density and cost. In the example where the additional material is epitaxial silicon germanium, the thickness of the additional material may be about 500 nm to about 800 nm. In general, the thickness should be such as to achieve the goal of strain relaxation above about 80% and a non-zero threading dislocation density of less than about 100/cm$^2$.

Figure 6:
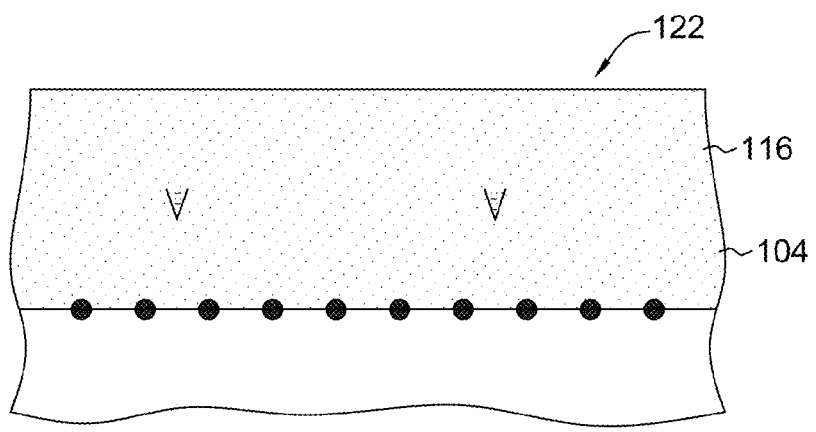
FIG. 6 depicts one example of the structure of FIG. 5 after planarizing the covering layer, in accordance with one or more aspects of the present invention.

FIG. 6 depicts one example of the structure of FIG. 5 after planarizing the layer 116 of semiconductor material. In one example, planarization of the surface 120 (see FIG. 5) to remove any indentations, such as indentations 118, can be accomplished using a form of CMP employing an ultra-high purity colloidal silica slurry having a slurry abrasive size of about 20 nm to about 30 nm and a relatively low removal rate of about 2 A/sec to about 3 A/sec). The end result is a defect-free surface 122, ready for further processing, or, optionally, repeating the cycle of defect exposure, fill-in and adding a covering layer until a desired defectivity level is achieved. Further, as will be discussed in more detail subsequently, planarized layer 116 has a strain relaxation degree above about 80% and a non-zero threading dislocation density of less than about 100/cm$^2$.

Disclosed above is a method of making a resulting structure of a defect-free, relaxed semiconductor layer on a semiconductor substrate. As used herein, the term "relaxed" refers to strain relaxation. As one skilled in the art will know, the size of the lattice of layer 104 (FIG. 1) changes (e.g., gets larger) compared to its natural state when applied to the substrate, in order to conform to the different size lattice (e.g., larger) of the substrate. The size change in the lattice from the natural state causes strain.

The disclosed method includes providing a starting semiconductor structure, the structure including a semiconductor substrate of at least one first semiconductor material, and a second layer of at least one second semiconductor material on the substrate. A lattice mismatch exists between the substrate and the second layer, and exposable defect(s) are present in the second layer. The method further includes exposing the at least one defect, filling-in any voids in the second layer created by the exposing, and covering the second layer after the filling-in with a semiconductor covering layer. The covering layer has a strain relaxation degree above about 80% and a threading dislocation density of less than about 100/cm$^2$. As one skilled in the art will know, "threading dislocation density" refers to one or more dislocations (e.g., threading dislocations) or irregularities in the lattice structure.

In one example, the semiconductor material of the substrate may include silicon, gallium arsenide or indium phosphide. In another example, the semiconductor substrate may include a bulk semiconductor substrate.

In one example, exposing the defect(s) includes removing material from the second layer, and filling-in any void(s) created with filler material(s). In one example, the filler material(s) include an oxide. In one example, removing material to expose the defect(s) includes etching the second layer using a dry etch, e.g., with HCl (hydrochloric acid) gas carried in H$_2$ (hydrogen gas) at about 600 to about 800 degrees Celsius under low pressure of about 10 torr. In one example, the filling-in includes conformally depositing a filler layer of the filler material(s), and etching the filler layer, stopping on the second layer.

In one example, the covering includes growing epitaxial semiconductor material on the filled-in second layer. In one example, the epitaxial semiconductor material may include one or more semiconductor materials from Groups III-V of the Periodic Table of Elements, for example, silicon and/or germanium (Si/Ge are group IV, Ga—As are 3-5). The particular epitaxial material chosen will depend on the semiconductor material used for the second layer. As noted above in the description of FIG. 1, the second layer generally includes one or more semiconductor materials from Groups III-V of the Periodic Table of Elements, for example, silicon germanium (SiGe), germanium (Ge), indium gallium arsenide (InGaAs), cadmium telluride (CdTe), or mercury cadmium telluride (CdHgTe). The epitaxial semiconductor material chosen should be such as to minimize or avoid strain due to lattice size differences. This can be achieved, for example, by ensuring the epitaxial material has an in-plane lattice constant about the same as the second layer material, and ideally the same. This will help avoid any additional defects.

Where silicon germanium is used as the epitaxial material, a percentage of germanium present in the silicon germanium may be in a range from about 20% to about 100%.

Along with the fabrication method described above, the present invention includes the resulting semiconductor structure. The structure includes a semiconductor substrate of one or more semiconductor materials, and a semiconductor covering layer over the substrate, the covering layer including one or more second semiconductor materials. A lattice mismatch exists between the substrate and the covering layer, and the covering layer has a strain relaxation degree above about 80% and a non-zero threading dislocation density of less than about 100/cm$^2$. In one example, the semiconductor structure has a non-zero thickness of less than about 0.5 microns.

In one example, the semiconductor material of the substrate includes silicon, gallium arsenide or indium phosphide. In another example, the semiconductor substrate includes a bulk semiconductor substrate.

The semiconductor covering layer may include materials from Groups III-V of the Periodic Table of Elements, and/or may include an epitaxial material. In one example, the semiconductor covering layer includes silicon germanium. Where silicon germanium is used, the percentage of germanium present in the silicon germanium may be in a range from about 20% to about 100%.

In another example, the semiconductor covering layer includes one of indium gallium arsenide, cadmium telluride and mercury cadmium telluride.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A semiconductor structure, comprising:
   a semiconductor substrate, comprising at least one first semiconductor material;
   a second layer of at least one second semiconductor material on the substrate; and
   a semiconductor covering layer on the second layer;
   wherein a lattice mismatch exists between the substrate and the covering layer, wherein at a boundary between the second layer and the semiconductor covering layer is at least one filled indent, the at least one filled indent being filled with filler material; and wherein the covering layer has a strain relaxation degree above about 80% and a non-zero threading dislocation density of less than about 100/cm$^2$.

2. The semiconductor structure of claim 1, wherein the semiconductor covering layer comprises an epitaxial material having an in-plane lattice constant about the same as the second layer.

3. The semiconductor structure of claim 1, wherein the semiconductor covering layer comprises at least one semiconductor material from Groups III-V of the Periodic Table of Elements.

4. The semiconductor structure of claim 3, wherein the at least one semiconductor material comprises one of germanium, silicon germanium, indium gallium arsenide, cadmium telluride and mercury cadmium telluride.

5. The semiconductor structure of claim 4, wherein the at least one semiconductor material comprises silicon germanium.

6. The semiconductor structure of claim 5, wherein a percentage of germanium present in the silicon germanium is in a range from about 20% to about 100%.

7. The semiconductor structure of claim 1, wherein the semiconductor structure has a non-zero thickness of less than about 0.5 microns.

8. The semiconductor structure of claim 1, wherein the at least one first semiconductor material of the substrate comprises one of silicon, gallium arsenide and indium phosphide.

9. The semiconductor structure of claim 1, wherein the semiconductor substrate comprises a bulk semiconductor substrate.

10. The semiconductor structure of claim 1, wherein the top surface of the semiconductor covering layer is planar and defect-free.

* * * * *